(12) United States Patent
Asano et al.

(10) Patent No.: US 11,411,343 B2
(45) Date of Patent: Aug. 9, 2022

(54) CIRCUIT BOARD DEVICE AND BOARD CONNECTOR

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Yasunori Asano, Mie (JP); Motoki Kubota, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/973,344

(22) PCT Filed: Jun. 18, 2019

(86) PCT No.: PCT/JP2019/024027
§ 371 (c)(1),
(2) Date: Dec. 8, 2020

(87) PCT Pub. No.: WO2019/244864
PCT Pub. Date: Dec. 26, 2019

(65) Prior Publication Data
US 2021/0249808 A1    Aug. 12, 2021

(30) Foreign Application Priority Data

Jun. 22, 2018    (JP) .............................. JP2018-118534

(51) Int. Cl.
*H01R 13/504*    (2006.01)
*H01R 12/57*    (2011.01)
(Continued)

(52) U.S. Cl.
CPC ........... *H01R 13/504* (2013.01); *H01R 12/57* (2013.01); *H01R 12/707* (2013.01);
(Continued)

(58) Field of Classification Search
CPC .... H01R 13/504; H01R 12/57; H01R 12/707; H01R 12/716; H01R 12/724;
(Continued)

(56) References Cited

U.S. PATENT DOCUMENTS 10,170,864 B1 *    1/2019    Hsu ................... H01R 13/5216

FOREIGN PATENT DOCUMENTS

JP    H08-306425 A    11/1996
JP    2010-212196 A    9/2010
(Continued)

OTHER PUBLICATIONS

International Search Report dated Jul. 30, 2019 for WO 2019/244864 A1 (3 pages).

*Primary Examiner* — Abdullah A Riyami
*Assistant Examiner* — Justin M Kratt
(74) *Attorney, Agent, or Firm* — Venjuris, P.C.

(57) ABSTRACT

It is aimed to prevent the breakage of solder joint portions due to the thermal deformation of a molded body. A circuit board device (A) includes a circuit board (10), a cover (32) and a molded body (52) to be provided on the circuit board (10), and a board connector (11) to be surface-mounted on the circuit board (10). The board connector (11) includes a housing (13) and metal members (24, 29) integrally mounted in or on the housing (13). The board connector (11) is surface-mounted on the circuit board (10) by solder- (Continued)

joining the metal members (24, 29). The molded body (52) is made of synthetic resin and surrounds the circuit board (10) and the metal members (24, 29) in a solder joint state. The cover (32) is embedded in the molded body (52) while being disposed to surround the metal members (24, 29).

10 Claims, 13 Drawing Sheets

(51) Int. Cl.
| | | |
|---|---|---|
| *H01R 12/71* | (2011.01) | |
| *H01R 13/42* | (2006.01) | |
| *H01R 43/24* | (2006.01) | |
| *H01R 12/72* | (2011.01) | |
| *H05K 3/28* | (2006.01) | |
| *H01R 12/70* | (2011.01) | |
| *H01R 13/405* | (2006.01) | |
| *H05K 1/18* | (2006.01) | |

(52) U.S. Cl.
CPC ......... *H01R 12/716* (2013.01); *H01R 12/724* (2013.01); *H01R 13/405* (2013.01); *H01R 13/42* (2013.01); *H01R 43/24* (2013.01); *H05K 3/284* (2013.01); *H05K 1/181* (2013.01); *H05K 2201/10189* (2013.01); *H05K 2203/1327* (2013.01)

(58) Field of Classification Search
CPC ...... H01R 13/405; H01R 13/42; H01R 43/24; H05K 3/284; H05K 1/181; H05K 2201/10189; H05K 2203/1327
See application file for complete search history.

(56) References Cited

FOREIGN PATENT DOCUMENTS

| | | | |
|---|---|---|---|
| JP | 2010212196 A | * | 9/2010 |
| JP | 2013-247057 A | | 12/2013 |
| JP | 2015-041510 A | | 3/2015 |

* cited by examiner

CIRCUIT BOARD DEVICE AND BOARD CONNECTOR

CROSS REFERENCE TO RELATED APPLICATIONS

This application is a national phase of PCT application No. PCT/JP2019/024027, filed on 18 Jun. 2019, which claims priority from Japanese patent application No. 2018-118534, filed on 22 Jun. 2018, all of which are incorporated herein by reference.

TECHNICAL FIELD

The present invention relates to a circuit board device and a board connector.

BACKGROUND

Patent Document 1 discloses a circuit board device in which a board connector is mounted on a surface of a circuit board. The board connector is configured by mounting fixing brackets and terminal fittings onto and into a housing. In mounting the board connector on the circuit board, the fixing brackets are placed on the surface of the circuit board, connecting end parts of the terminal fittings are placed on a printed circuit of the circuit board, and the connecting end parts of the fixing brackets and the terminal fittings are joined to the circuit board by soldering by a reflow method. If the entire circuit board and a part of the board connector are surrounded by a molded body made of synthetic resin in this circuit board device, it is possible to waterproof the printed circuit, waterproof exposed parts of the terminal fittings outside the housing and reinforce solder joint portions.

PRIOR ART DOCUMENT

Patent Document

Patent Document 1: JP 2015-041510A

SUMMARY OF THE INVENTION

Problems to be Solved

In the case of using the circuit board device in a high-temperature environment, if a synthetic resin having a relatively high linear expansion coefficient is used as a material of the molded body, the thermally expanded molded body presses the terminal fittings and the fixing brackets in parallel to the circuit board. If the terminal fittings and the fixing brackets are pressed, a shear force acts in the solder joint portions of the terminal fittings and the fixing brackets. Thus, there is a concern that the solder joint portions are broken and the terminal fittings and the fixing brackets are peeled off from the circuit board.

The present invention was completed on the basis of the above situation and aims to prevent the breakage of solder joint portions due to the thermal deformation of a molded body.

Means to Solve the Problem

A first aspect of the invention is directed to a circuit board device with a circuit board, a cover and a molded body to be provided on the circuit board, and a board connector to be surface-mounted on the circuit board, wherein the board connector includes a housing and metal members integrally mounted in or on the housing, the board connector is surface-mounted on the circuit board by solder-joining the metal members, the molded body is made of synthetic resin and surrounds the circuit board and the metal members in a solder joint state, and the cover is embedded in the molded body while being disposed to surround the metal members.

A second aspect of the invention is directed to a board connector with a housing, metal members integrally mounted in or on the housing, and a cover disposed to surround the metal members between the housing and the cover, wherein the metal members are surface-mounted on a circuit board by solder joint and surrounded in a close contact state together with the circuit board by a molded body, and the cover is embedded in the molded body.

Effect of the Invention

When the molded body is thermally expanded or contracted, not the entire molded body, but a cover internal area disposed inside the cover and in contact with the metal members, out of the molded body, presses the metal members. A pressing force from a cover external area disposed outside the cover and not in contact with the metal members, out of the molded body, hardly acts on the metal members. The pressing force acting on the metal members is reduced since the pressing force from the cover external area of the molded body does not act. Therefore, the breakage of solder joint portions can be prevented.

DETAILED DESCRIPTION TO EXECUTE THE INVENTION

Figure 1:
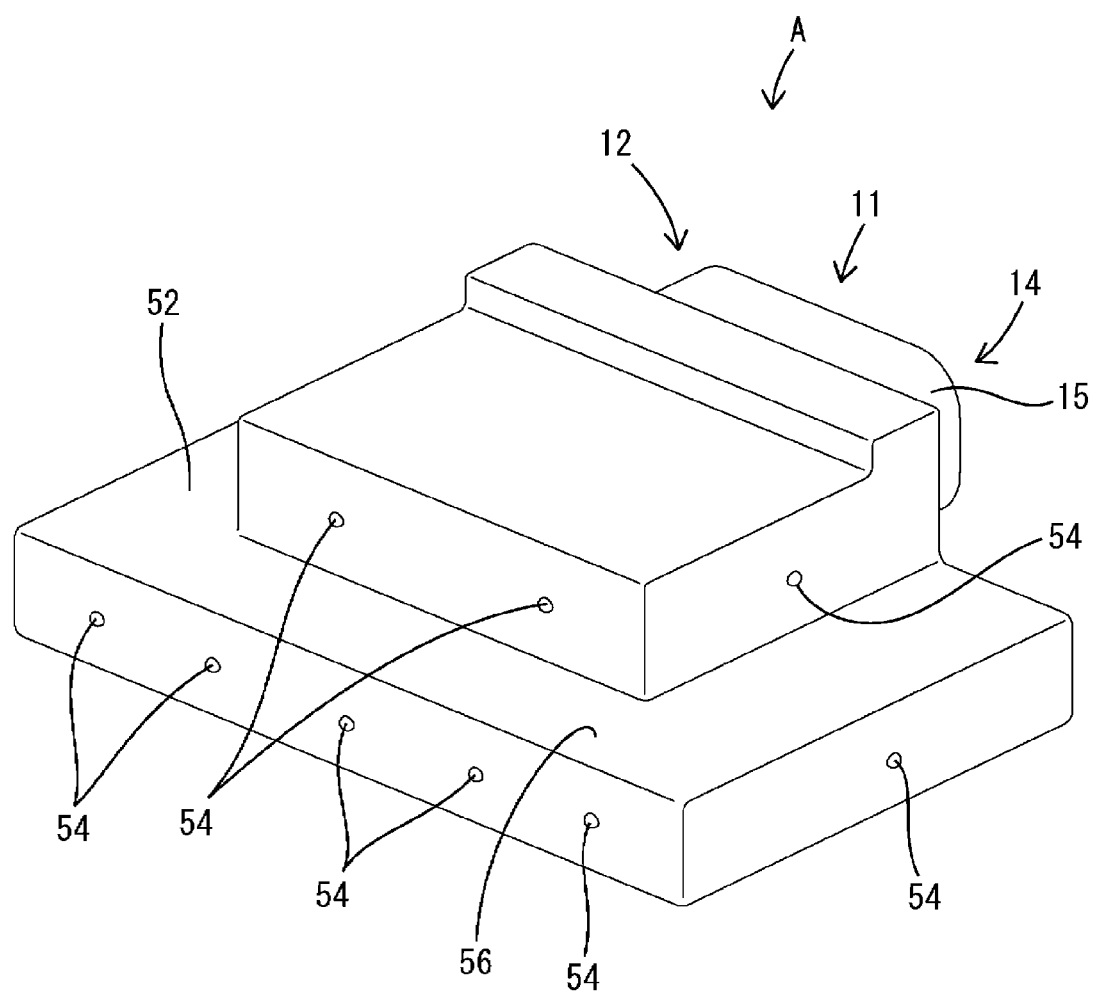
FIG. 1 is a perspective view of a circuit board device of a first embodiment.
Figure 2:
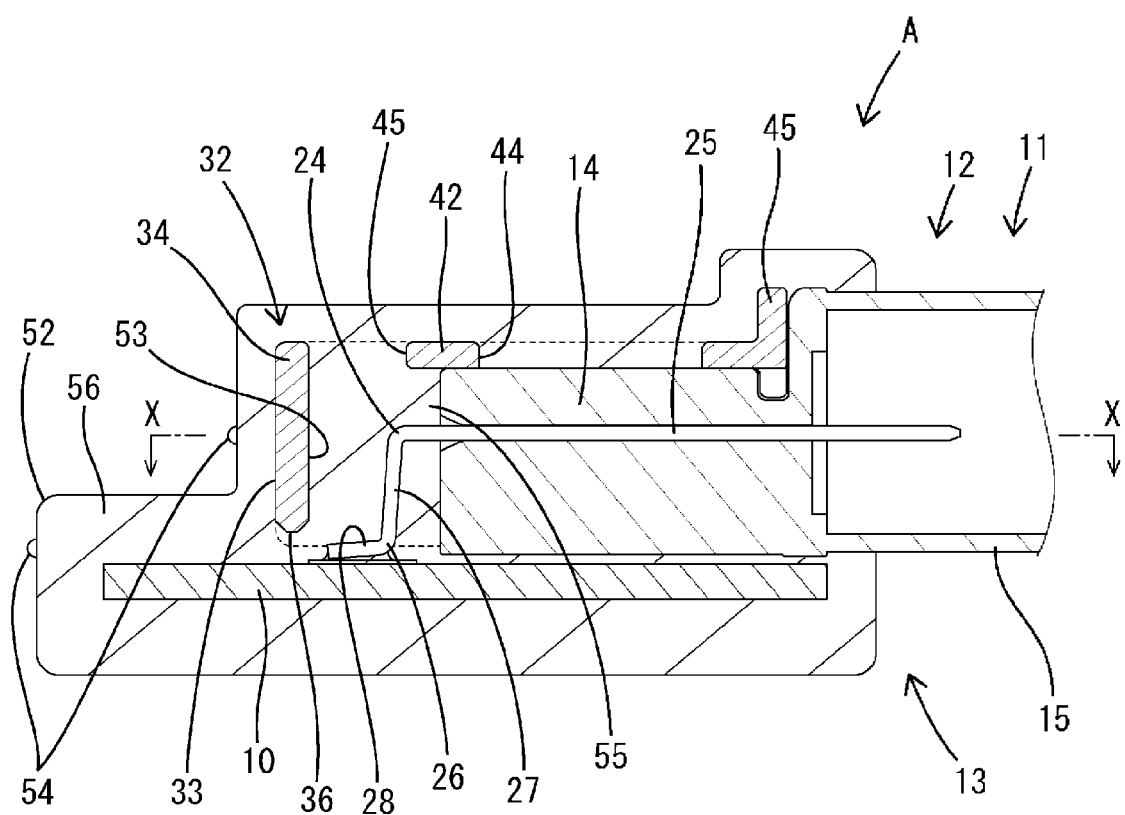
FIG. 2 is a side view in section of the circuit board device.
Figure 3:
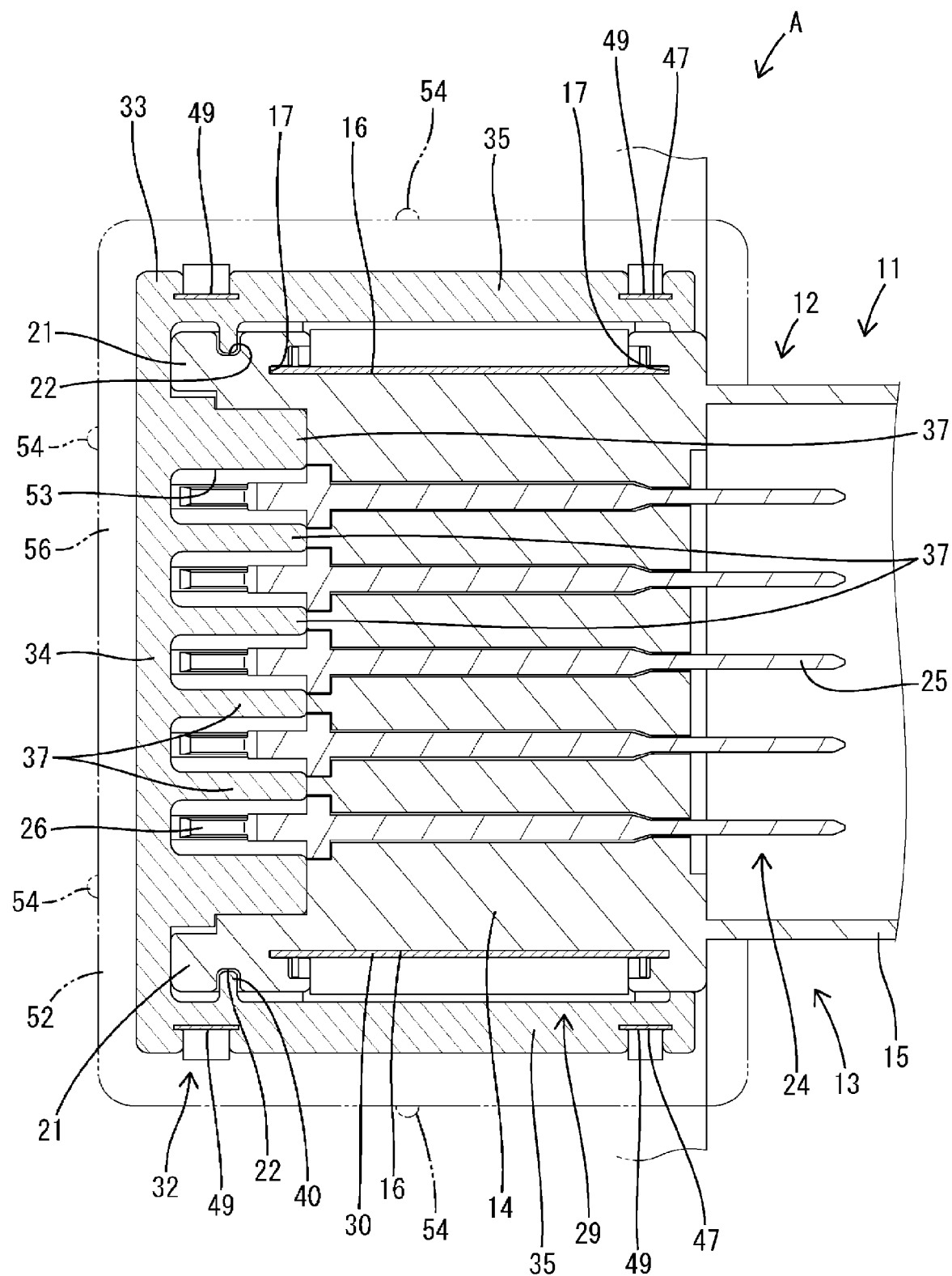
FIG. 3 is a section along X-X of FIG. 2.
Figure 4:
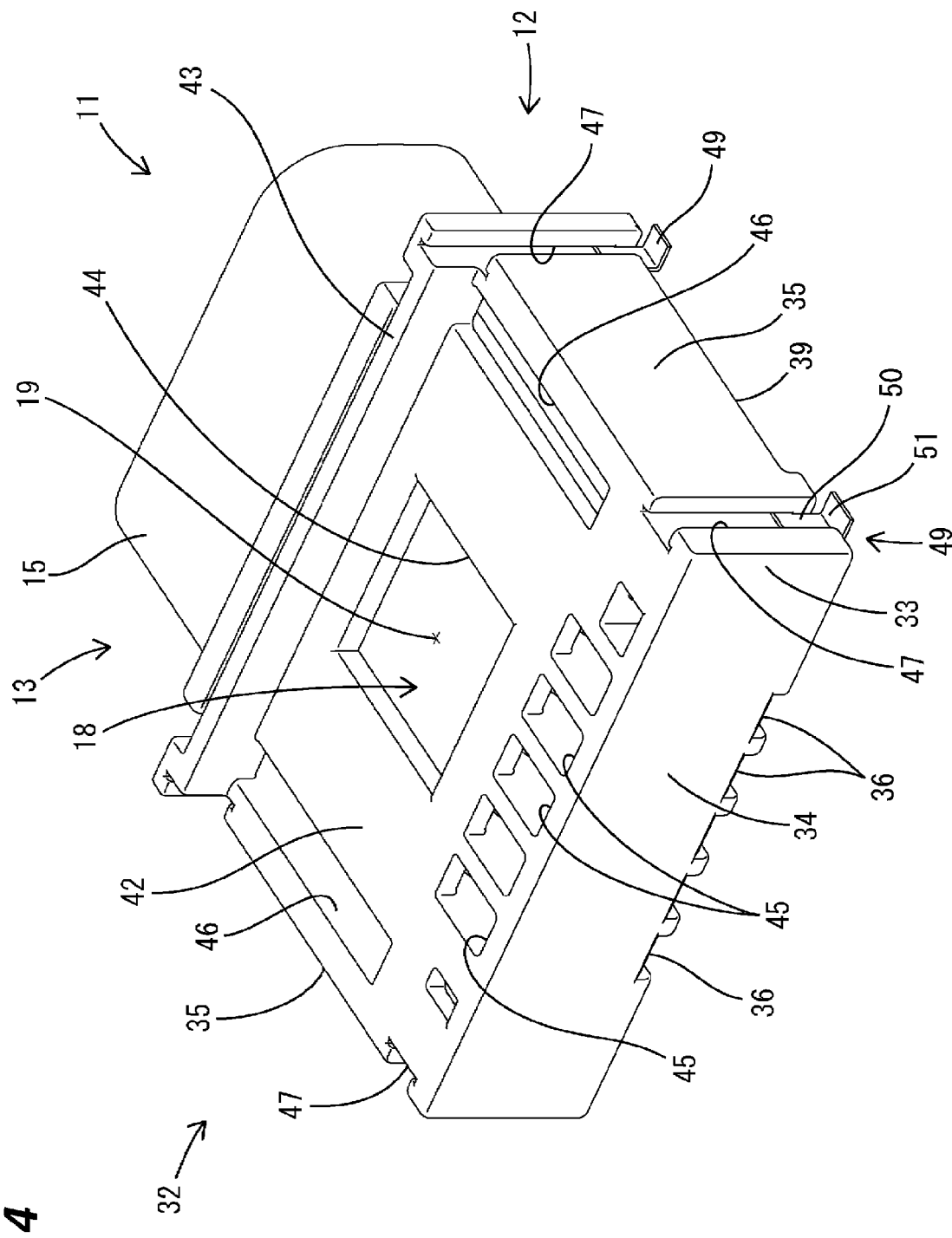
FIG. 4 is a perspective view of a board connector.
Figure 5:
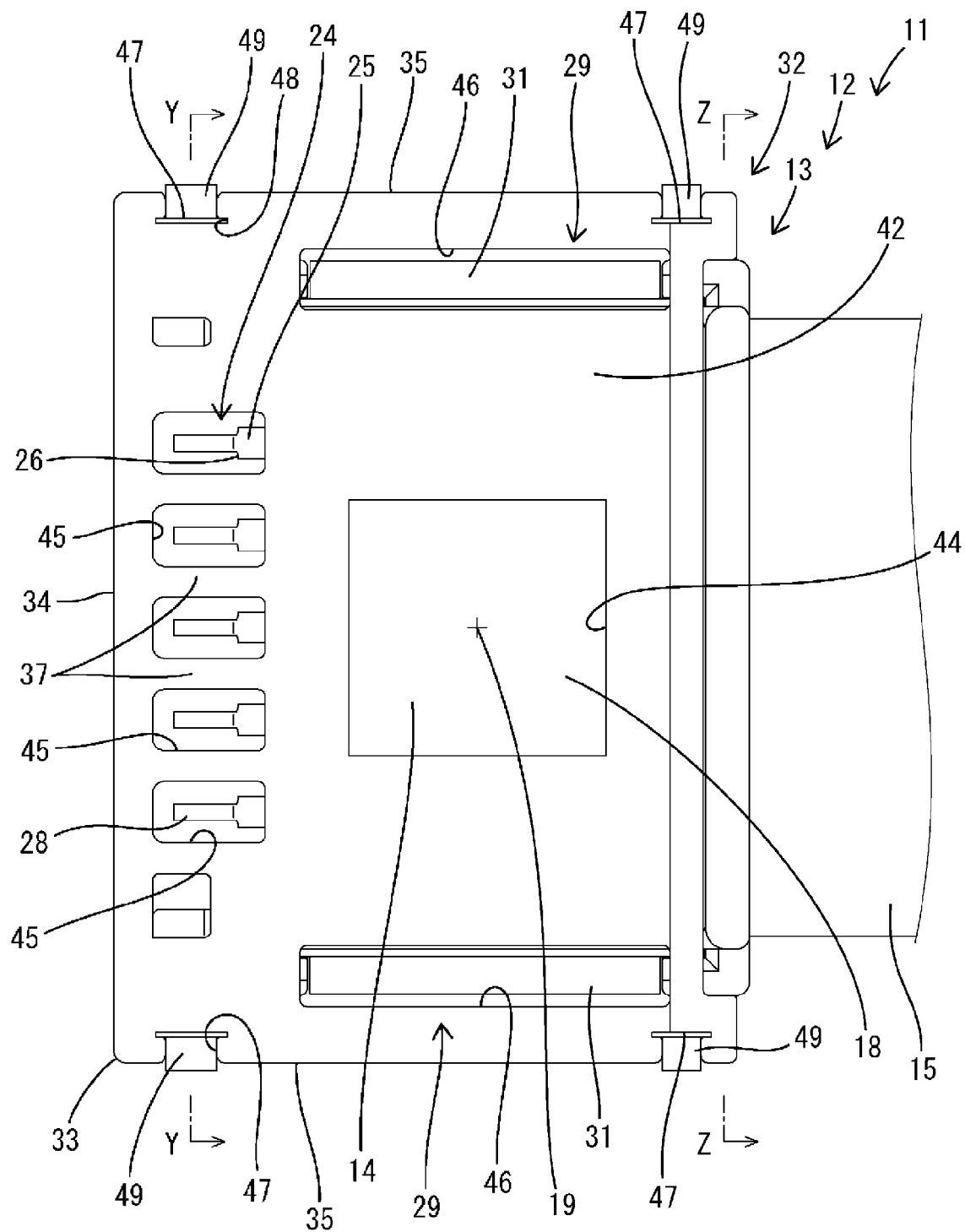
FIG. 5 is a plan view of the board connector.
Figure 6:
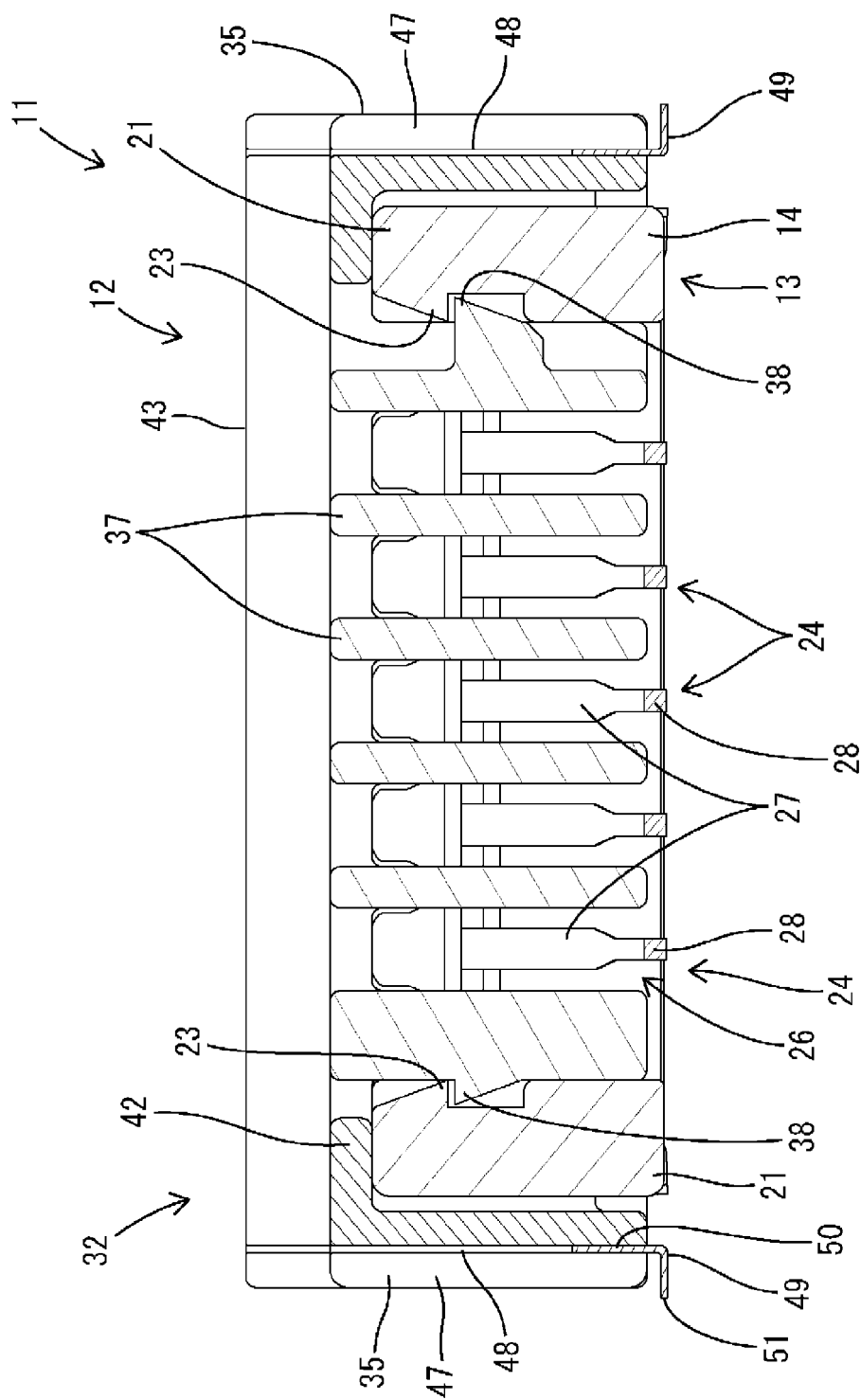
FIG. 6 is a section along Y-Y of FIG. 5.
Figure 7:
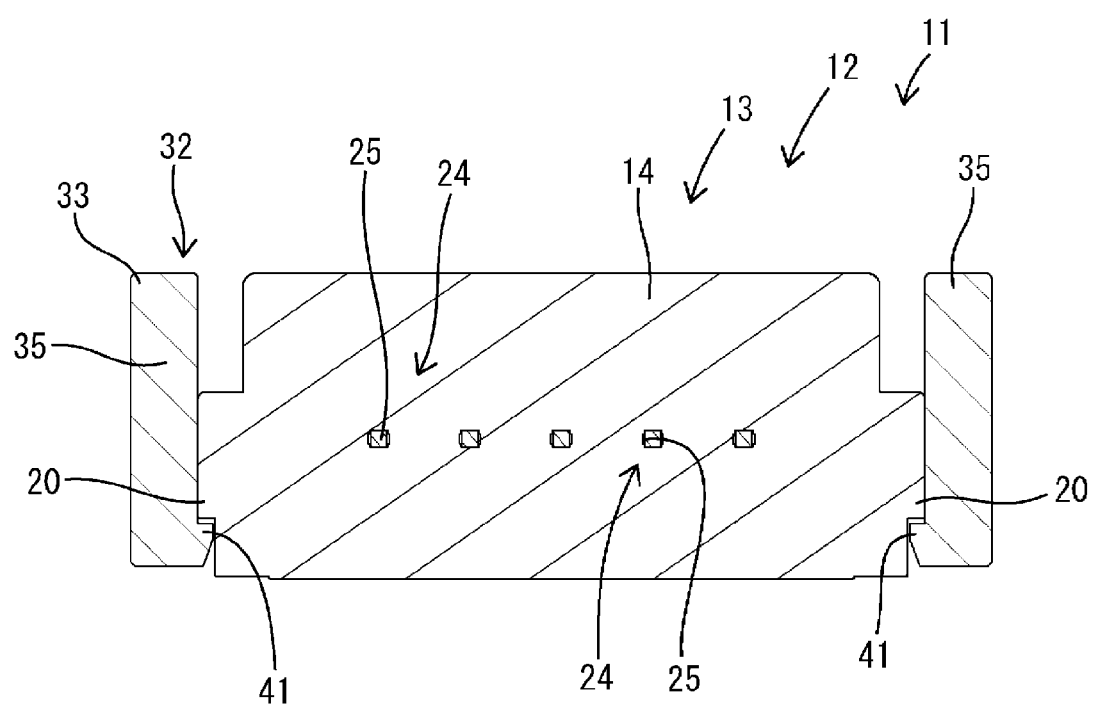
FIG. 7 is a section along Z-Z of FIG. 5.
Figure 8:
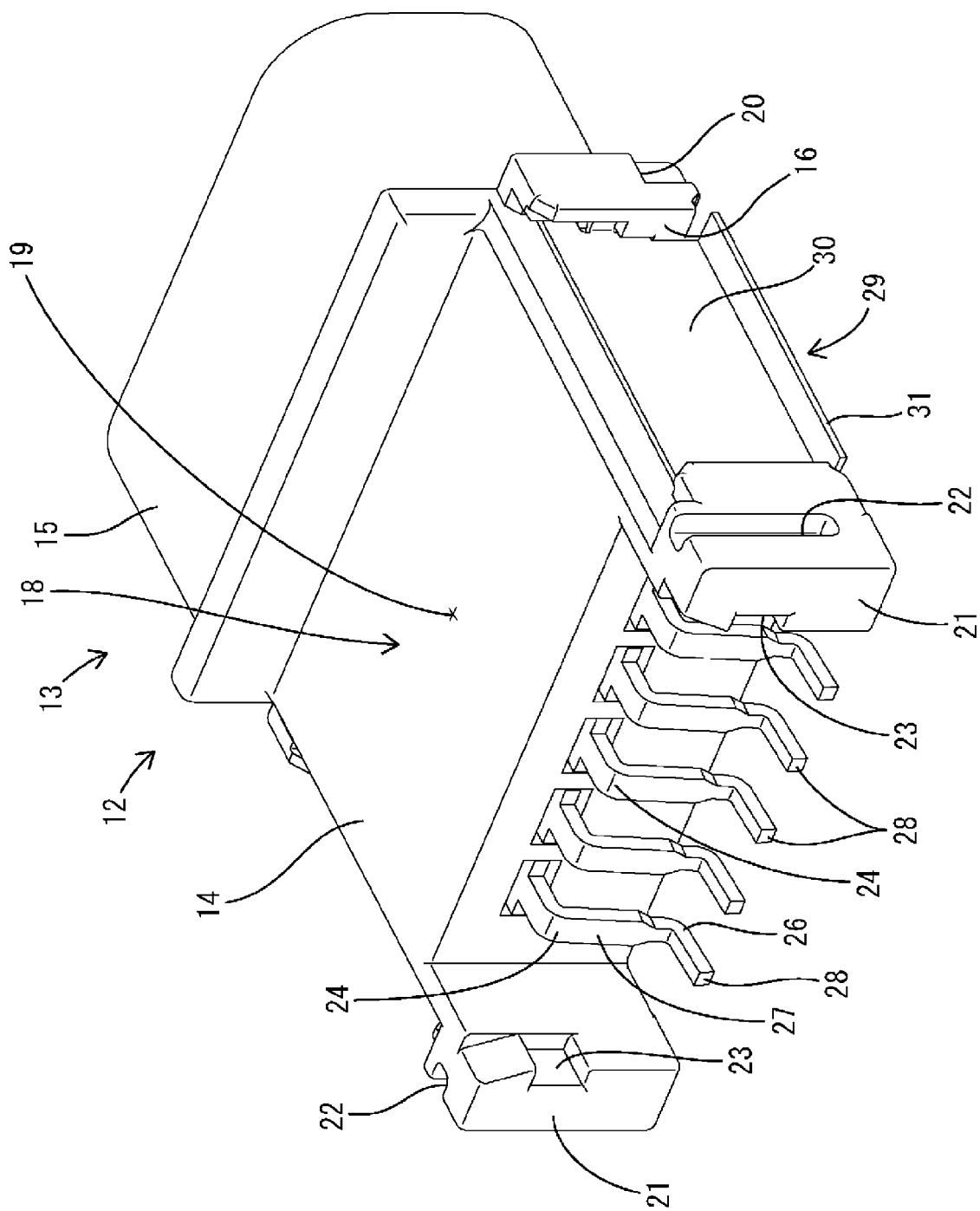
FIG. 8 is a perspective view of a housing module.
Figure 9:
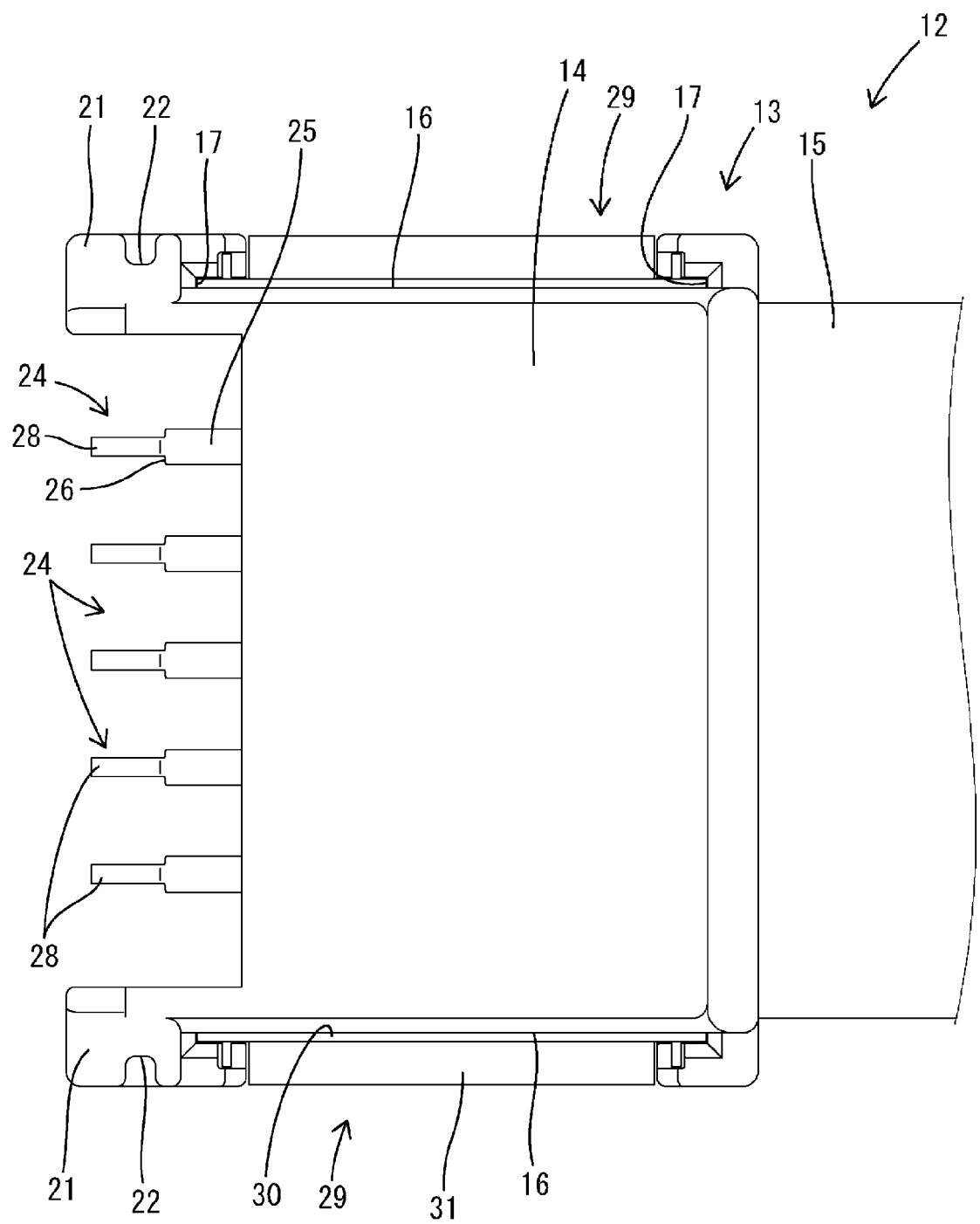
FIG. 9 is a plan view of the housing module.
Figure 10:
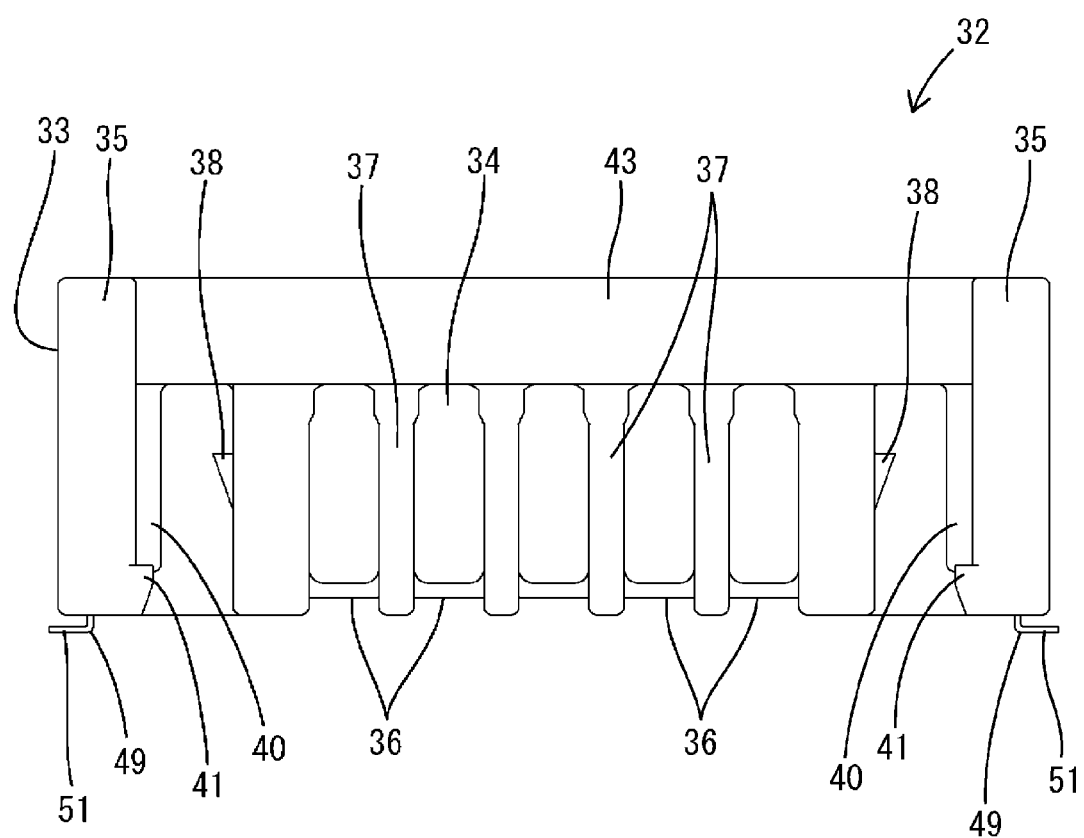
FIG. 10 is a front view of a cover.
Figure 11:
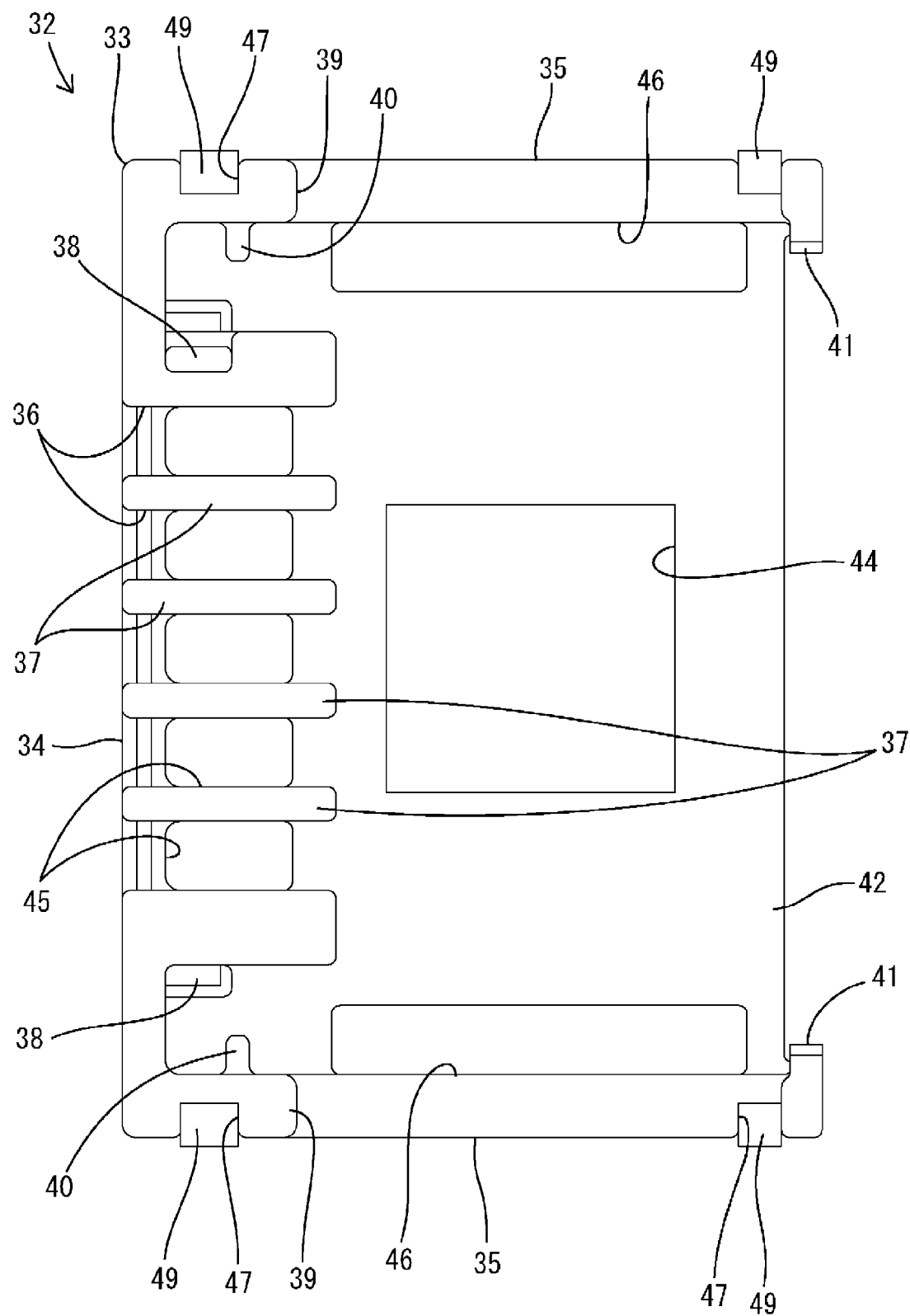
FIG. 11 is a bottom view of the cover.

The first and second aspects of the invention may be such that the cover is assembled with the housing. According to this configuration, when the cover external area disposed outside the cover, out of the molded body, is thermally deformed, the influence of that thermal deformation on the metal members can be reliably restricted by the cover.

The first and second aspects of the invention may be such that the cover is fixed to or fixable to the circuit board. According to this configuration, even if the cover external area disposed outside the cover, out of the molded body, is thermally deformed, the influence of that thermal deformation on the metal members can be reliably restricted by the cover. Further, even if a force for curving the circuit board acts on the circuit board by the thermal deformation of the molded body, a curved deformation of the circuit board can be suppressed by the rigidity of the cover.

The first and second aspects of the invention may be such that the cover is formed with an upper wall portion disposed to face the circuit board across the metal members. According to this configuration, even if the cover external area disposed above the cover and not in contact with the metal members, out of the molded body, is thermally deformed, the influence of that thermal deformation on the metal members can be reliably restricted.

The first and second aspects of the invention may be such that the cover includes a peripheral wall portion facing an outer surface of the housing across the metal members, and the upper wall portion is directly connected to an upper end part of the peripheral wall portion. According to this configuration, the rigidity of the peripheral wall portion can be enhanced by the upper wall portion.

The first and second aspects of the invention may be such that the upper wall portion is formed with an upper surface opening open in an area corresponding to the metal members in a plan view. According to this configuration, a solder joint state of the metal members can be confirmed, such as visually, through the upper surface opening from above the cover.

The first and second aspects of the invention may be such that the cover is assembled with the housing, and the upper wall portion is formed with a transfer opening for exposing a suction area in an upper surface of the housing. According to this configuration, in transferring the board connector onto the circuit board, the metal members can be positioned with respect to the circuit board with high accuracy by sucking the suction area of the housing by a transfer device.

The first and second aspects of the invention may be such that the transfer opening and the suction area are set in a range including a center of gravity of the board connector in a plan view. According to this configuration, the board connector can be lifted up in a stable posture when being sucked.

The first and second aspects of the invention may be such that the cover includes a peripheral wall portion facing an outer surface of the housing across the metal members, and a peripheral surface cutout portion is formed in an edge part of the peripheral wall portion proximate to the circuit board. According to this configuration, the solder joint state of the metal members can be confirmed, such as visually, through the peripheral surface cutout portion from outside the cover.

The first and second aspects of the invention may be such that the metal members include a plurality of terminal fittings disposed in parallel behind the housing, the plurality of terminal fittings are conductively solder-joined to the circuit board, the cover includes a rear wall portion disposed behind the plurality of terminal fittings, and the rear wall portion is formed with partitioning portions partitioning between adjacent ones of the terminal fittings. According to this configuration, the rigidity of the rear wall portion can be enhanced by the partitioning portions and a volume of the cover internal area between the rear wall portion and the housing, out of the molded body, can be reduced by as much as the partitioning portions.

The first aspect of the invention may be such that the cover is arranged at an intermediate position of a straight path connecting a gate mark on an outer surface of the molded body and the metal members. According to this configuration, in injection-molding the molded body, an injection pressure of molten resin injected from a gate acts on the metal members in a reduced state. Therefore, the breakage of the solder joint portions of the metal members due to the injection pressure of the molten resin can be prevented.

First Embodiment

Hereinafter, a first specific embodiment of the present invention is described with reference to FIGS. 1 to 11. Note that, in the following description, an oblique right-upper side in FIGS. 1. 4 and 8 and a right side in FIGS. 2, 3, 5, 9 and 11 is defined as a front side concerning a front-rear direction. Upper and lower sides shown in FIGS. 1, 2, 4, 6 to 8 and 10 are directly defined as upper and lower sides concerning a vertical direction.

A circuit board device A of the first embodiment includes a circuit board 10, a board connector 11 and a molded body 52, and the circuit board 10 and the board connector 11 are integrated by solder joint and the molded body 52. Note that, in the following description, it is assumed that plate surfaces of the circuit board 10 horizontally extend for the sake of convenience. A circuit (not shown) is formed on the upper surface (surface) of the circuit board 10 by printing. A laterally central part of a front end part of the upper surface of the circuit board 10 serves as a fixing area for fixing the placed board connector 11.

The board connector 11 is configured by assembling a housing module 12, a cover 32 and pegs 49. The housing module 12 includes a housing 13 made of synthetic resin, a plurality of terminal fittings 24 (metal members as claimed), and a pair of left and right fixing brackets 29 (metal members as claimed). The plurality of terminal fittings 24 are mounted with relative displacements with respect to the housing 13 restricted. The pair of left and right fixing brackets 29 are mounted with relative displacements with respect to the housing 13 restricted.

The housing 13 includes a terminal holding portion 14 in the form of a flat block and a receptacle 15 in the form of a rectangular tube cantilevered forward from the outer peripheral edge of the front end surface of the terminal holding portion 14. The terminal holding portion 14 (housing 13) is formed with a plurality of press-fit holes for mounting the terminal fittings 24 into the terminal holding portion 14. The plurality of press-fit holes penetrate in the front-rear direction and are disposed in parallel in a lateral direction (direction parallel to the circuit board 10).

The terminal holding portion 14 (housing 13) is formed with a pair of left and right accommodation recesses 16 for mounting the fixing brackets 29 on the terminal holding portion 14. The pair of left and right accommodation recesses 16 are formed by recessing both left and right outer side surfaces of the terminal holding portion 14, and are open upward and downward of the terminal holding portion 14. Vertical accommodation grooves 17 are formed in both front and rear end parts of the accommodation recess 16.

The upper surface of the terminal holding portion 14 has a suction area 18 formed by a flat surface. The suction area 18 is a laterally central part of the upper surface of the terminal holding portion 14 and disposed in an area slightly in front of a center in the front-rear direction. The suction area 18 is set in an area including a center of gravity 19 of the board circuit 11 in a plan view. Front-side locking portions 20 facing downward (toward the circuit board 10) are formed in front end parts of the both left and right outer side surfaces of the terminal holding portion 14.

The terminal holding portion 14 is formed with a pair of left and right protection wall portions 21. The pair of protection wall portions 21 project rearward from rear end edge parts of the both left and right outer side surfaces of the terminal holding portion 14. Vertically extending guide grooves 21 are formed in the outer side surfaces of the pair of protection wall portions 21. The upper ends of the guide grooves 22 are open in the upper end surfaces of the protection wall portions 21. The pair of protection wall portions 21 are formed with rear-side locking portions 23 formed by recessing the inner side surfaces thereof.

The terminal fitting 24 is formed by applying bending and the like to an elongated metal wire material (metal bar material) having a predetermined shape. The terminal fitting 24 includes a press-fitting portion 25 extending in the front-rear direction (direction parallel to the circuit board 10) and a board connecting portion 26 extending downward substantially at a right angle from the rear end of the press-fitting portion 25. Accordingly, the terminal fitting 24 is formed into an L shape inverted in the vertical or front-rear direction as a whole in a side view. The terminal fitting 24 is mounted into the terminal holding portion 14 by press-fitting the press-fitting portion 25 into the press-fit hole from behind the terminal holding portion 14. The terminal fitting 24 mounted in the terminal holding portion 14 is integrated with the housing 13. A front end part of the press-fitting portion 25 projects from the front end surface of the terminal holding portion 14 and is surrounded by the receptacle 15.

The board connecting portion 26 is composed of a leg portion 27 and a conductive solder joint portion 28. The leg portion 27 has a vertically linear shape and has a length to reach the upper surface of the circuit board 10 from the rear end of the press-fitting portion 25. The conductive solder joint portion 28 is cantilevered rearward (in a direction away from the rear surface of the housing 13) substantially at a right angle from the lower end of the leg portion 27. The conductive solder joint portion 28 is parallel to the upper surface of the circuit board 10 and conductively secured to the circuit of the circuit board 10 by a reflow method.

The fixing bracket 29 is formed by applying bending and the like to a metal plate material having a predetermined shape. The fixing bracket 29 is composed of a bracket body portion 30 and a fixing solder joint portion 31. The fixing bracket 29 is formed into an L shape or a laterally inverted L shape in a front view. The fixing bracket 29 is integrated with the housing 13 by being mounted on the terminal holding portion 14. In mounting the fixing bracket 29, the bracket body portion 30 is accommodated into the accommodation recess 16 from above the terminal holding portion 14 and both front and rear end edge parts of the bracket body portion 30 are fit into the accommodation grooves 17. The housing 13 is restricted from moving relatively upward with respect to the fixing brackets 29.

The fixing solder joint portion 31 is cantilevered laterally outward (in a direction away from the housing 13) substantially at a right angle from the lower end edge of the bracket body portion 30. The fixing solder joint portion 31 is parallel to the upper surface of the circuit board 10 and secured to the upper surface of the circuit board 10 by the reflow method. The housing 13 is fixed to the upper surface of the circuit board 10 by the fixing brackets 29.

The cover 32 is a single member made of synthetic resin and including a peripheral wall portion 33 and an upper wall portion 42. The peripheral wall portion 33 is composed of a rear wall portion 34 and a pair of left and right side wall portions 35. The rear wall portion 34 is disposed behind the leg portions 27 and the conductive solder joint portions 28 of the plurality of terminal fittings 24. The rear wall portion 34 is formed with a plurality of rear surface cutout portions 36 (peripheral surface cutout portion as claimed) formed by partially cutting a lower end edge part (area proximate to the upper surface of the circuit board 10) of the rear wall portion 34 at a plurality of positions. The plurality of rear surface cutout portions 36 are disposed at positions individually corresponding to the plurality of conductive solder joint portions 28 in the lateral direction.

The rear wall portion 34 is formed with a plurality of partitioning portions 37. The plurality of partitioning portions 37 are cantilevered forward (inwardly of the cover 32) from the front surface (surface facing the housing 13 and the terminal fittings 24 in the front-rear direction) of the rear wall portion 34. The plurality of peripheral surface cutout portions are disposed at positions corresponding to gaps between the conductive solder joint portions 28 adjacent in the lateral direction. Thus, the plurality of rear wall cutout portions 36 and the plurality of partitioning portions 37 are alternately disposed side by side in the lateral direction. Rear-side locking projections 38 are respectively formed on both left and right end parts of the rear wall portion 34. The rear-side locking projections 38 project laterally outward to face the inner surfaces of the rear end parts of the side wall portions 35.

The pair of side wall portions 35 are cantilevered forward from both left and right side edge parts of the rear wall portion 34. The side wall portions 35 are formed with a plurality of side surface cutout portions 39 (peripheral surface cutout portion as claimed) formed by cutting lower end edge parts (areas proximate to the upper surface of the circuit board 10) of the side wall portions 35. The side surface cutout portions 39 are open in areas corresponding to the fixing solder joint portions 31 of the fixing brackets 29 in the front-rear direction. Vertically extending guide ribs 40 are respectively formed on rear end parts of the inner side surfaces of the both left and right side wall portions 35 (inner surface of the cover 32). Front-side locking projections 41 projecting laterally inward are formed on front end parts of the both left and right side wall portions 35.

The upper wall portion 42 is parallel to the upper surface of the circuit board 10 and disposed above the plurality of terminal fittings 24 and the pair of fixing brackets 29. The upper wall portion 42 has a substantially rectangular shape in a plan view. Since being connected substantially at a right angle to the upper end edge of the rear wall portion 34 and the upper end edges of the side wall portions 35, the upper wall portion 42 functions to reinforce the rear wall portion 34 and the side wall portions 35. By this reinforcing function, the rear wall portion 34 and the side wall portions 35 are restricted from being deformed to be curved in a plan view. Further, the upper wall portion 42 is formed with a reinforcing rib 43 rising upward along the front end edge of the upper wall portion 42. The rigidity of the upper wall portion 42 is enhanced by this reinforcing rib 43.

The upper wall portion 42 is formed with a transfer opening 44, a plurality of rear edge openings 45 (upper surface opening as claimed) and a pair of left and right side edge openings 46 (upper surface opening as claimed). The transfer opening 44 penetrates through the upper wall portion 42 in the vertical direction (wall thickness direction). In a plan view, the transfer opening 44 is open to correspond to the suction area 18 of the housing 13. The plurality of rear edge openings 45 are disposed along the rear end edge of the upper wall portion 42. In a plan view (in the front-rear direction and lateral direction), the plurality of rear edge openings 45 are open in areas individually corresponding to the plurality of conductive solder joint portions 28. The pair of side edge openings 46 are disposed along both left and right side edges of the upper wall portion 42. In a plan view (in the front-rear direction and lateral direction), the pair of side edge openings 46 are open in areas individually corresponding to the fixing solder joint portions 31.

A pair of front and rear mounting recesses 47 extending in the vertical direction are formed in the outer side surface of each of the both left and right side wall portions 35. The pair of front and rear mounting recesses 47 are disposed in both front and rear end parts of the side wall portion 35. Vertically extending mounting grooves 48 are formed in both front and rear end parts of each mounting recess 47. The peg 49 is mounted into each mounting recess 47 and integrated with the cover 32. With the pegs 49 mounted in the housing 13, a relative upward movement of the housing 13 with respect to the pegs 49 is restricted.

The peg 49 is formed by bending a metal plate material. The peg 49 is composed of a peg body portion 50 and a cover solder joint portion 51. The peg 49 is formed into an L shape or a laterally inverted L shape in a front view. The cover solder joint portion 51 is cantilevered laterally outward (in a direction away from the housing 13) substantially at a right angle from the lower end edge of the peg body portion 50.

The peg 49 is mounted on the cover 32 and integrated with the cover 32. In mounting the peg 49 on the cover 32, the peg body portion 50 is accommodated into the mounting recess 47 from above the cover 32 and both front and rear end edge parts of the peg body portion 50 are fit into the mounting grooves 48. The cover solder joint portion 51 is parallel to the upper surface of the circuit board 10 and secured to the upper surface of the circuit board 10 by the reflow method. The cover 32 is fixed to the upper surface of the circuit board 10 by pairs of left and right pegs 49.

The cover 32 is assembled with the terminal holding portion 14 from above the housing 13. In assembling, the guide ribs 40 of the cover 32 are fit into the guide grooves 22 of the housing 13. The cover 32 assembled with the housing 13 is held with a relative movement in the front-rear direction with respect to the housing 13 restricted by fitting the guide ribs 40 into the guide grooves 22. Further, the pair of side wall portions 35 are proximately facing or in contact with the outer side surfaces of the terminal holding portion 14, whereby the cover 32 is held with a lateral relative movement with respect to the housing 13 restricted.

Further, with the cover 32 assembled with the housing 13, the front-side locking projections 41 of the cover 32 are locked to the front-side locking portions 20 of the housing 13 from below and the rear-side locking projections 38 of the cover 32 are locked to the rear-side locking portions 23 of the housing 13 from below. By the locking action of these, the cover 32 is restricted from being relatively displaced upward with respect to the housing 13. In the above manner, the cover 32 and the housing 13 are integrated and the assembling of the board connector 11 is completed.

The board connector 11 is placed on the upper surface of the circuit board 10 and the conductive solder joint portions 28, the fixing solder joint portions 31 and the cover solder joint portions 51 are secured to the upper surface of the circuit board 10 in a reflow process. In the above way, the board connector 11 is mounted on the upper surface of the circuit board 10 by the solder joint portions 28, 31 and 51.

The molded body 52 is made of synthetic resin and molded to surround the entire circuit board 10 and an area of the board connector 11 except the receptacle 15. In other words, the entire circuit board 10 and the area of the board connector 11 except the receptacle 15 are embedded in the molded body 52.

In molding the molded body 52, the already joined circuit board 10 and board connector 11 are set in a cavity of a mold (not shown), and molten resin, which is a material of the molded body 52, is injected into the mold. Gates (not shown) from which the molten resin is injected are disposed behind the terminal fittings 24 and lateral to the fixing brackets 29. The molten resin is injected toward the board connector 11 substantially in parallel to the upper surface of the circuit board 10 and collides with the outer surface of the cover 32. The molten resin after the collision with the outer surface of the cover 32 flows in the cavity and is filled into a cover external space outside the cover 32.

Part of the molten resin after the collision with the outer surface of the cover 32 flows inside the cover 32 (cover internal space 53 defined by the cover 32 and the terminal holding portion 14) through the rear surface cutout portions 36, the side surface cutout portions 39, the rear edge openings 45 and the side edge openings 46 to be filled inside the cover 32. The molten resin filled into the cover internal space 53 is held in close contact with the outer surfaces of the leg portions 27 and the conductive solder joint portions 28 of the terminal fittings 24, the fixing brackets 29 and the terminal holding portion 14. If the molten resin is solidified, the molding of the molded body 52 is completed and, at the same time, the molded body 52 and the board connector 11 are integrated. In the above way, the manufacturing of the circuit board device A is completed.

A plurality of gate marks 54 in the form of small projections are formed in parts of the outer surface of the molded body 52 corresponding to the gates. The plurality of gate marks 54 are disposed on rear and side parts of the board connector 11. Since a shear force acts on the conductive solder joint portions 28 and the fixing solder joint portions 31 if the leg portions 27 of the terminal fittings 24 and the bracket body portions 30 of the fixing brackets 29 exposed on the outer surface of the housing 13 directly receive an injection pressure of the molten resin, there is a concern that these solder joint portions 28, 31 are broken and the terminal fittings 24 and the fixing brackets 29 are peeled off from the circuit board 10.

However, since the rear wall portion 34 of the cover 32 is present between the gate marks 54 located behind the board connector 11 and the terminal fittings 24, the molten resin injected toward the terminal fittings 24 from behind collides with the outer surface (rear surface) of the rear wall portion 34 before colliding with the terminal fittings 24 (leg portions 27). Further, since the side wall portions 35 of the cover 32 are present between the gate marks 54 located on the side parts of the board connector 11 and the fixing brackets 29, the molten resin laterally injected toward the fixing brackets 29 collides with the outer surfaces (side surfaces rear surfaces) of the side wall portions 35 before colliding with the fixing brackets 29 (bracket body portions 30). Therefore, the injection pressure of the molten resin acting on the terminal fittings 24 and the fixing brackets 29 is reduced.

The molded body 52 exhibits a waterproof function by surrounding the board connector 11 and the circuit board 10 in close contact with these. By the waterproof function of the molded body 52, the entire surface of the circuit board 10 is sealed in a liquid-tight manner, joint parts of the circuit board 10 and the terminal fittings 24 are sealed in a liquid-tight manner, joint parts of the circuit board 10 and the fixing brackets 29, and joint parts of the circuit board 10 and the pegs 49 are sealed in a liquid-tight manner. Further, the molded body 52 has a reinforcing function. By this reinforcing function, the joint strength of the conductive solder joint portions 28 of the terminal fittings 24 to the circuit board 10 is enhanced, the joint strength of the fixing solder joint portions 31 of the fixing brackets 29 to the circuit board 10 is enhanced, and the joint strength of the cover solder joint portions 51 of the pegs 49 to the circuit board 10 is enhanced.

A linear expansion coefficient of the material of the molded body 50 is different from that of the material of the circuit board 10 and that of the material of the housing 13. Accordingly, if the circuit board device A is used in an environment where a temperature change is large, there is a difference between a thermal deformation amount (volume change amount due to thermal expansion and thermal contraction) of the molded body 52 and that of the circuit board 10 and that of the housing 13. Due to this difference in thermal deformation amount, the molded body 52 presses the housing 13, the terminal fittings 24 and the fixing brackets 29 in parallel to the surface (mounting surface) of the circuit board 10. By this pressing force of the molded body 52, a shear stress in parallel to the circuit board 10 is generated in the conductive solder joint portions 28 and the fixing solder joint portions 31. Thus, there is a concern that the conductive solder joint portions 28 and the fixing solder joint portions 31 are broken by the shear stress.

As a countermeasure against that, the molded body 52 is divided into a cover internal area 55 and a cover external area 56 by the cover 32 embedded in the molded body 52. The cover internal area 55 is a part of the molded body 52 filled in the cover internal space 53 surrounded by the inner surface of the cover 32 and the outer surface of the housing 13. The cover external area 56 is a part of the molded body 52 disposed outside the cover 32. The conductive solder joint portions 28 and the fixing solder joint portions 31 are disposed in the cover internal space 53. Thus, the cover internal area 55 is in contact with the conductive solder joint portions 28 and the fixing solder joint portions 31, but the cover external area 56 is not in contact with the conductive solder joint portions 28 and the fixing solder joint portions 31.

Accordingly, out of the molded body 52, only the cover internal area 55 directly presses the conductive solder joint portions 28 and the fixing solder joint portions 31 when the molded body 52 is thermally deformed, and a pressing force from the cover external area 56 is blocked by the cover 32. Specifically, the pressing force of the cover external area 56 acting from behind the board connector 11 is received by the rear wall portion 34 and, therefore, does not reach the conductive solder joint portions 28.

Further, the pressing force of the cover external area 56 acting from lateral sides of the board connector 11 is received by the side wall portions 35 and, therefore, does not reach the fixing solder joint portions 31. As just described, the pressing force acting on the conductive solder joint portions 28 and the fixing solder joint portions 31 is reduced by as much as the pressing force of the cover external area 56. In this way, the shear force generated in the conductive solder joint portions 28 and the fixing solder joint portions 31 is suppressed to be low.

Further, the cover 32 is not only integrally assembled with the housing 13, but also fixed to the circuit board 10 via the pegs 49. Accordingly, the cover 32 is not moved in a direction toward the conductive solder joint portions 28 and the fixing solder joint portions 31 even if receiving the pressing force of the cover external area 56 from outside. Therefore, it can be effectively suppressed or prevented that the pressing force of the cover external area 56 reaches the conductive solder joint portions 28 and the fixing solder joint portions 31.

The circuit board device A of the first embodiment includes the circuit board 10, the cover 32 and the molded body 52 to be provided on the circuit board 10 and the board connector 11 to be surface-mounted on the circuit board 10. The board connector 11 includes the housing 13 and the terminal fittings 24 and the fixing brackets 29 integrally mounted in and on the housing 13. By solder-joining the terminal fittings 24 and the fixing brackets 29, the board connector 11 is surface-mounted on the upper surface of the circuit board 10. The molded body 52 is made of synthetic resin, surrounds the circuit board 10, the terminal fittings 24 and the fixing brackets 29 while being held in close contact with these, and surrounds the circuit board 10 and the metal members (terminal fittings 24 and fixing brackets 29) in a solder joint state. The cover 32 is embedded in the molded body 52 while being disposed to surround the terminal fittings 24 between the rear surface of the housing 13 and the cover 32 and surround the fixing brackets 29 between the side surfaces of the housing 13 and the cover 32.

As described above, out of the molded body 52, the part disposed inside the cover 32 and in contact with the terminal fittings 24 and the fixing brackets 29 serves as the cover internal area 55. Further, out of the molded body 52, the part disposed outside the cover 32 serves as the cover external area 56 not in contact with the terminal fittings 24 and the fixing brackets 29. According to the above configuration, what presses the terminal fittings 24 and the fixing brackets 29 when the molded body 52 is thermally deformed (thermally expanded and thermally contacted) is not the entire molded body 52, but only the cover internal area 55 of the molded body 52. Since the pressing force from the cover external area 56 of the molded body 52 hardly acts on the terminal fittings 24 and the fixing brackets 29, the pressing force of the molded body 52 that presses the terminal fittings 24 and the fixing brackets 29 is accordingly reduced. In this way, the breakage of the conductive solder joint portions 28 of the terminal fittings 24 and the fixing solder joint portions 31 of the fixing brackets 29 can be prevented.

Further, the cover 32 is assembled with the housing 13 and integrated with the housing 13. In this way, a positional deviation of the cover 32 with respect to the terminal fittings 24 and the fixing brackets 29 is restricted when the injection pressure of the molten resin acts on the cover 32 in the molding process of the molded body 52. Thus, the influence of the injection pressure on the terminal fittings 24 and the fixing brackets 29 can be reliably reduced. Further, when the cover external area 56 disposed outside the cover 32, out of the molded body 52, is thermally expanded or contracted, the influence of that thermal deformation on the terminal fittings 24 and the fixing brackets 29 can be reliably restricted by the cover 32.

Further, the cover 32 is fixed to the circuit board 10 by the pegs 49. In this way, when the injection pressure of the molten resin acts on the cover 32 in the molding process of the molded body 52, the positional deviation of the cover 32 with respect to the terminal fittings 24 and the fixing brackets 29 is restricted. Thus, the influence of the injection pressure on the terminal fittings 24 and the fixing brackets 29 can be reliably reduced. Further, when the cover external area 56 disposed outside the cover 32, out of the molded body 52, is thermally expanded or contracted, the influence of that thermal deformation on the terminal fittings 24 and the fixing brackets 29 can be reliably restricted by the cover 32.

Further, the cover 32 includes the pair of left and right side wall portions 35 at a right angle to the upper surface of the circuit board 10 and extending in the front-rear direction, and the rear wall portion 34 at a right angle to the upper surface of the circuit board 10 and extending in the lateral direction. The cover 32 formed with the pair of left and right side wall portions 35 and the rear wall portion 34 has rigidity against such a curved deformation as to create a height difference between the both front and rear end parts and the central part in the front-rear direction and rigidity against such a curved deformation as to create a height difference between the both left and right end parts and the central part in the lateral direction. The cover 32 is fixed to the upper surface (mounting surface) of the circuit board 10 by the pegs 49 at four positions spaced apart in the front-rear direction and the lateral direction (both front and rear end parts of the pair of side wall portions 35). Therefore, even if a force acts to curve the circuit board 10 due to the thermal expansion or contraction of the molded body 52, the curved deformation of the circuit board 10 is suppressed by the rigidity of the cover 32.

Further, the cover 32 is formed with the upper wall portion 42 disposed to face the mounting surface (upper surface) of the circuit board 10 across the terminal fittings 24 and the fixing brackets 29. Therefore, even if the cover external area 56 (part disposed above the cover 32 and not in contact of the terminal fittings 24 and the fixing brackets 29, out of the molded body 52) is thermally expanded or contracted, the influence of that thermal deformation on the terminal fittings 24 and the fixing brackets 29 can be reliably restricted.

Further, the cover 32 includes the peripheral wall portion 33 (rear wall portion 34 and pair of side wall portions 35) facing the outer surface of the housing 13 across the metal members (terminal fittings 24 and fixing brackets 29). The upper wall portion 42 is directly connected to the upper end part of the peripheral wall portion 33 (rear wall portion 34 and pair of side wall portions 35). According to this configuration, since the rigidity of the peripheral wall portion 34 is enhanced by the upper wall portion 42, it can be suppressed that the rear wall portion 34 is curved and deformed to bulge in the front-rear direction and the side wall portions 35 are curved and deformed to bulge in the lateral direction.

Further, the upper wall portion 42 is formed with the rear edge openings 45 open in the areas corresponding to the terminal fittings 24 in a plan view. In this way, a solder joint state of the conductive solder joint portions 28 can be confirmed, such as visually, through the rear edge openings 45 from above the cover 32. Similarly, the upper wall portion 42 is formed with the side edge openings 46 open in the areas corresponding to the fixing brackets 29 in a plan view. In this way, a solder joint state of the fixing solder joint portions 31 can be confirmed, such as visually, through the side edge openings 46 from above the cover 32.

Further, with the cover 32 assembled with the housing 13, the upper wall portion 42 of the cover 32 is placed on the upper surface of the housing 13. Thus, there is a concern that the suction area 18 formed in the upper surface of the housing 13 is covered by the upper wall portion 42. As a countermeasure against this, the upper wall portion 42 is formed with the transfer opening 44 for exposing the suction area 18. Therefore, in transferring the board connector 10 onto the circuit board 10, the suction area 18 of the housing 13 can be sucked by a transfer device (not shown). In this way, the terminal fittings 24 and the fixing brackets 29 integrated with the housing 13 can be positioned with respect to the circuit board 10 with high accuracy. Further, since the transfer opening 44 and the suction area 18 are set in a range including the center of gravity 19 of the board connector 11 in a plan view, the board connector 11 can be lifted up in a stable posture when being sucked.

Further, since the cover 32 includes the rear wall portion 34 facing the outer surface of the housing 13 across the terminal fittings 24, there is a concern that the solder joint parts of the conductive solder joint portions 28 are covered by the rear wall portion 34. As a countermeasure measure against this, the rear surface cutout portions 36 are formed in the lower edge part of the rear wall portion 34 proximate to the circuit board 10. In this way, the solder joint state of the conductive solder joint portions 28 can be confirmed, such as visually, through the rear surface cutout portions 36 from behind (outside) the cover 32. Further, since the cover 32 includes the side wall portions 35 facing the outer surface of the housing 13 across the fixing brackets 29, there is a concern that solder joint parts of the fixing solder joint portions 31 are covered by the side wall portions 35. As a countermeasure measure against this, the side surface cutout portions 39 are formed in the lower edge parts of the side wall portions 35 proximate to the circuit board 10. In this way, the solder joint state of the fixing solder joint portions 31 can be confirmed, such as visually, through the side surface cutout portions 39 from lateral sides of (outside) the cover 32.

Further, the plurality of terminal fittings 24 are disposed in parallel in the rear part of the housing 13 and conductively solder-joined to the circuit board 10. The cover 32 includes the rear wall portion 34 disposed behind the plurality of terminal fittings 24, and the rear wall portion 34 is formed with the partitioning portions 37 partitioning between laterally adjacent ones of the terminal fittings 24. According to this configuration, the rigidity of the rear wall portion 34 can be enhanced by the partitioning portions 37. Further, a volume of the cover internal area 55 between the rear wall portion 34 and the housing 13, out of the molded body 52, can be reduced by as much as the partitioning portions 37. In this way, the pressing force applied to the terminal fittings 24 when the cover internal area 55 is thermally deformed is reduced. Further, the circuit board device A of the first embodiment includes the circuit board 10, the board connector 11, the molded body 52 and the cover 32 embedded in the molded body 52. The rear wall portion 34 of the cover 32 is disposed at an intermediate position of a straight path (not shown) connecting the gate marks 54 on the outer surface of the molded body 52 and the terminal fittings 24 in the front-rear direction. In injection-molding the molded body 52, the molten resin injected from the gates of the mold toward the terminal fittings 24 collides with the rear wall portion 34 before contacting the terminal fittings 24. Therefore, the influence of the injection pressure of the molten resin on the terminal fittings 24 is reduced. In this way, the breakage of the conductive solder joint portions 28 of the terminal fittings 24 due to the injection pressure of the molten resin can be prevented.

Similarly, the side wall portions 35 of the cover 32 are disposed at intermediate positions of straight paths (not shown) connecting the gate marks 54 on the outer surface of the molded body 52 and the fixing brackets 29 in the lateral direction. In injection-molding the molded body 52, the molten resin injected from the gates of the mold toward the fixing brackets 29 collides with the side wall portions 35 before contacting the fixing brackets 29. Therefore, the influence of the injection pressure of the molten resin on the fixing brackets 29 is reduced. In this way, the breakage of the fixing solder joint portions 31 of the fixing brackets 29 due to the injection pressure of the molten resin can be prevented.

Second Embodiment

Figure 12:
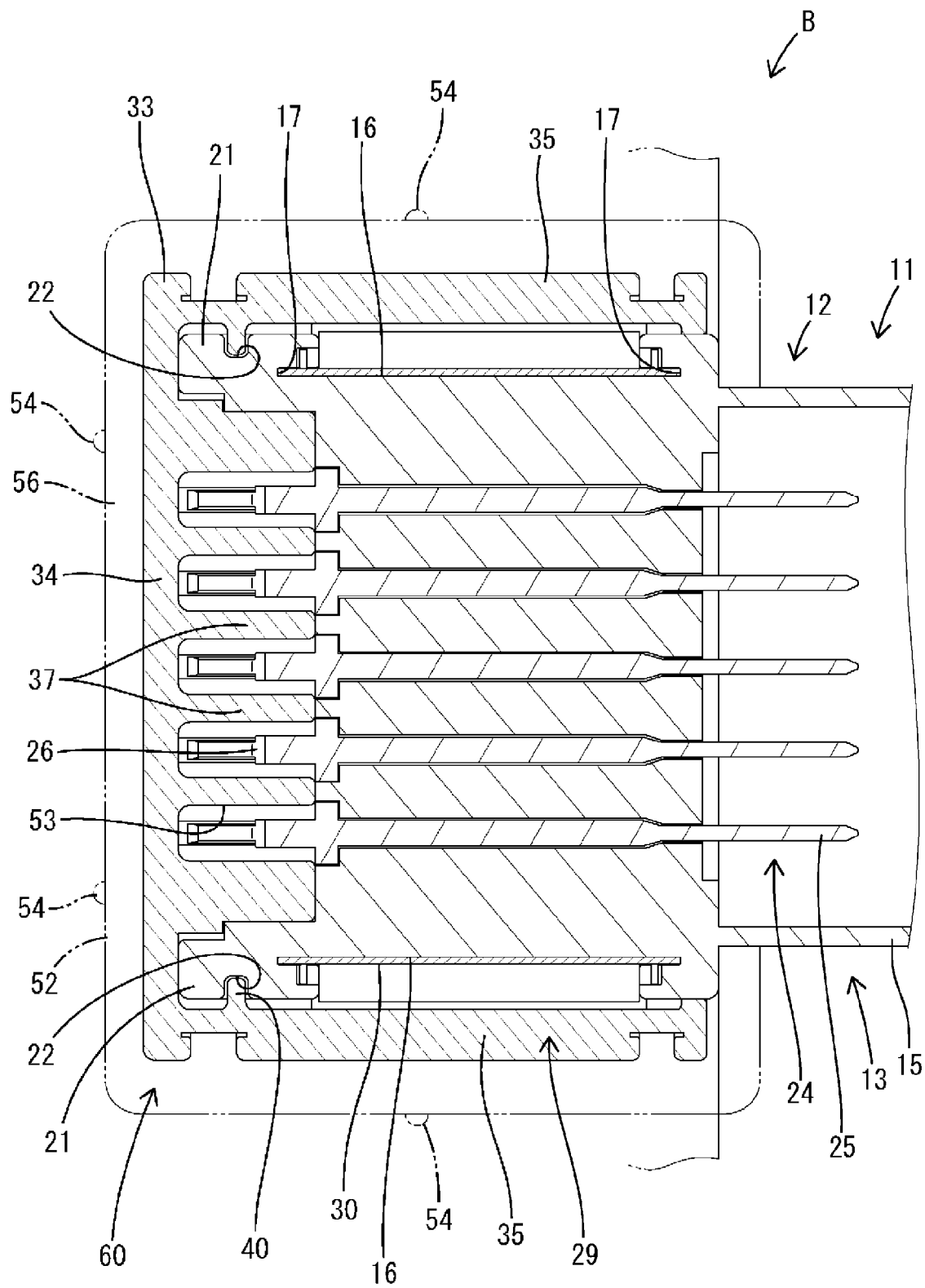
FIG. 12 is a plan view in section showing a circuit board device of a second embodiment.
Figure 13:
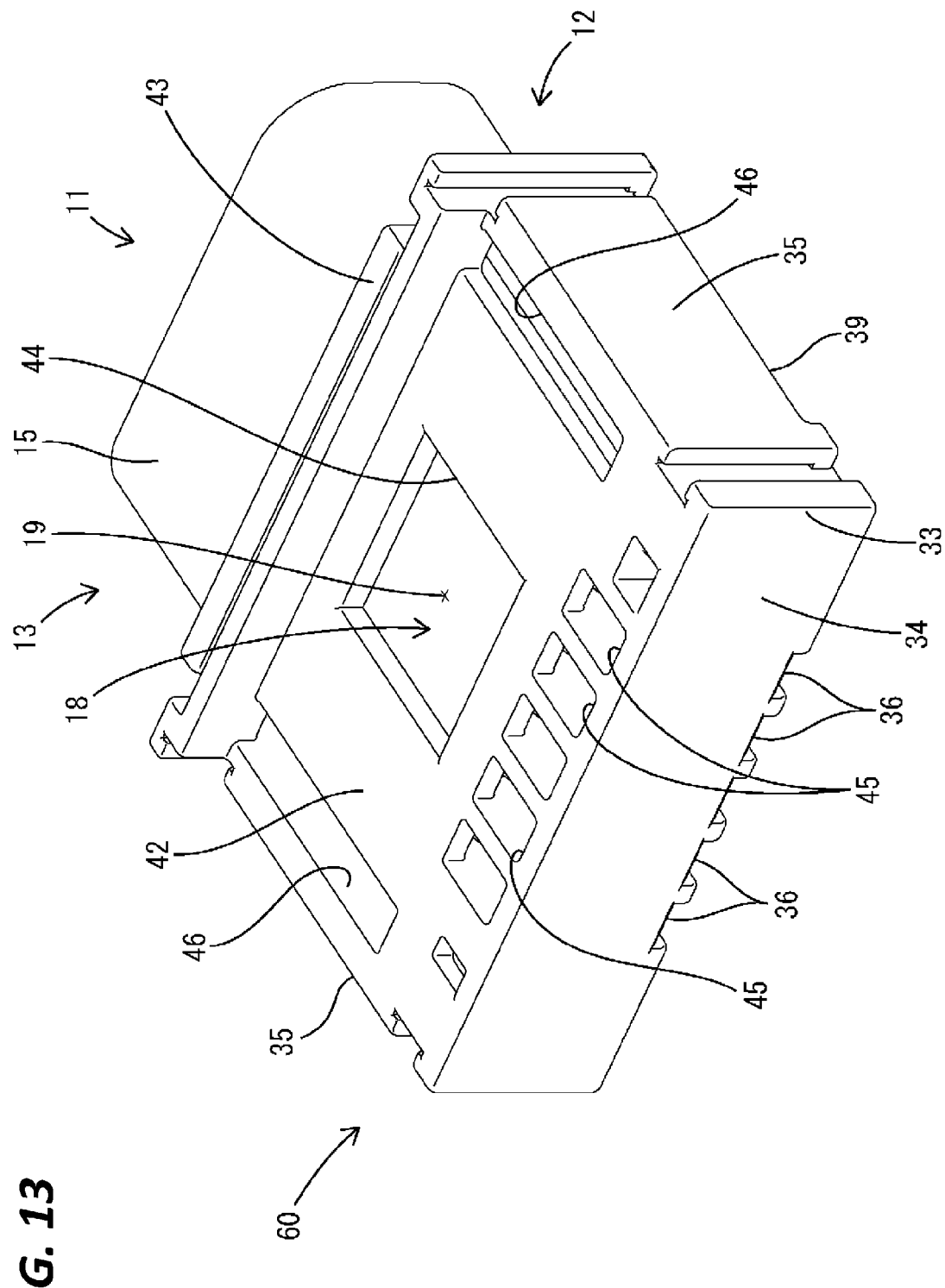
FIG. 13 is a perspective view of a board connector of the second embodiment.

Next, a second specific embodiment of the present invention is described with reference to FIGS. 12 and 13. A circuit board device B of the second embodiment differs from that of the first embodiment in the configuration of a cover 60. The cover 32 of the first embodiment is fixed to the upper surface of the circuit board 10 by the pegs 49. In contrast, the cover 60 of the second embodiment is not fixed to a circuit board 10 and is integrally assembled with a housing 13. Since the other configuration is the same as in the first embodiment, the same components are denoted by the same reference signs and the structure, functions and effects thereof are not described.

Other Embodiments

The present invention is not limited to the above illustrated and described embodiments. For example, the following embodiments are also included in the technical scope of the present invention.

(1) Although the rear wall portion is formed with the partitioning portions in the above embodiments, a rear wall portion may include no partitioning portion.

(2) Although the cover is assembled with the housing and fixed to the circuit board in the above embodiments, a cover may be fixed to a circuit board without being assembled with a housing or may be assembled with a housing without being fixed to a circuit board.

(3) Although the cover is a single member in the above embodiments, a cover dedicated for terminal fittings and a cover dedicated for fixing brackets may be separately provided.

(4) Although the cover includes the upper wall portion in the above embodiments, a cover may include no upper wall portion.

(5) Although the upper wall portion of the cover has the reinforcing function by being directly connected to the rear wall portion and the side wall portions in the above embodiments, an upper wall portion may not be directly connected to a rear wall portion and side wall portions.

(6) Although the upper surface openings are formed in the upper wall portion of the cover in the above embodiments, an upper wall portion may include no upper surface opening.

(7) Although the peripheral wall portion of the cover is formed with the peripheral surface cutout portions in the above embodiments, a peripheral wall portion may include no peripheral surface cutout portion.

(8) Although the upper wall portion of the cover is formed with the transfer opening in the above embodiments, a cover may be formed with no transfer opening and a transfer device may suck the upper surface of the cover and transfer the cover to a circuit board.

LIST OF REFERENCE NUMERALS

A, B . . . circuit board device
10 . . . circuit board
11 . . . board connector
12 . . . housing module
13 . . . housing
14 . . . terminal holding portion
15 . . . receptacle
16 . . . accommodation recess
17 . . . accommodation groove
18 . . . suction area
19 . . . center of gravity
20 . . . front-side locking portion
21 . . . protection wall portion
22 . . . guide groove
23 . . . rear-side locking portion
24 . . . terminal fitting (metal member)
25 . . . press-fitting portion
26 . . . board connecting portion
27 . . . leg portion
28 . . . conductive solder joint portion
29 . . . fixing bracket (metal member)
30 . . . bracket body portion
31 . . . fixing solder joint portion
32 . . . cover
33 . . . peripheral wall portion
34 . . . rear wall portion
35 . . . side wall portion
36 . . . rear surface cutout portion (peripheral surface cutout portion)
37 . . . partitioning portion
38 . . . rear-side locking projection
39 . . . side surface cutout portion (peripheral surface cutout portion)
40 . . . guide rib
41 . . . front-side locking projection
42 . . . upper wall portion
43 . . . reinforcing rib
44 . . . transfer opening
45 . . . rear edge opening (upper surface opening)
46 . . . side edge opening (upper surface opening)
47 . . . mounting recess
48 . . . mounting groove
49 . . . peg
50 . . . peg body portion
51 . . . cover solder joint portion
52 . . . molded body
53 . . . cover internal space
54 . . . gate mark
55 . . . cover internal area
56 . . . cover external area
60 . . . cover

What is claimed is:

1. A circuit board device, comprising:
a circuit board;
a board connector including a housing and a plurality of terminal fittings integrally mounted in the housing, the board connector being surface-mounted on the circuit board,
a cover fixed to the circuit board to cover a portion of the housing in which the plurality of terminal fittings are mounted; and
a molded body made of synthetic resin and molded to surround the circuit board and a portion of the board connector,
wherein:
the board connector is surface-mounted on the circuit board by solder-joining the plurality of terminal fittings,
the cover is embedded in the molded body while being disposed to surround the plurality of terminal fittings,
the cover is formed with an upper wall portion disposed to face the circuit board across the plurality of terminal fittings,
the cover is assembled with the housing, and
the upper wall portion is formed with a transfer opening configured to expose a suction area in an upper surface of the housing.

2. The circuit board device of claim 1, wherein the cover is assembled with the housing.

3. The circuit board device of claim 1, wherein the cover is fixable to the circuit board.

4. The circuit board device of claim 1, wherein:
the cover includes a peripheral wall portion facing an outer surface of the housing across the plurality of terminal fittings, and
the upper wall portion is directly connected to an upper end part of the peripheral wall portion.

5. The circuit board device of claim 1, wherein the upper wall portion is formed with an upper surface opening in an area corresponding to the plurality of terminal fittings in a plan view.

6. The circuit board device of claim 1, wherein the transfer opening and the suction area are set in a range including a center of gravity of the board connector in a plan view.

7. The circuit board device of claim 1, wherein:
the cover includes a peripheral wall portion facing an outer surface of the housing across the plurality of terminal fittings, and
a peripheral surface cutout portion is formed in an edge part of the peripheral wall portion proximate to the circuit board.

8. The circuit board device of claim 1, wherein:
the plurality of terminal fittings are disposed in parallel behind the housing,
the plurality of terminal fittings are conductively solder-joined to the circuit board,
the cover includes a rear wall portion disposed behind the plurality of terminal fittings, and
the rear wall portion is formed with partitioning portions partitioning between adjacent ones of the terminal fittings.

9. The circuit board device of claim 1, wherein the cover is arranged at an intermediate position of a straight path connecting a gate mark on an outer surface of the molded body and the plurality of terminal fittings.

10. A board connector that is surface-mounted on a circuit board, the board connector comprising:
a housing;
a plurality of terminal fittings integrally mounted in the housing; and
a cover fixed to the circuit board to cover a portion of the housing in which the plurality of terminal fittings are mounted,
wherein:
the plurality of terminal fittings are surface-mounted on the circuit board by solder joint and surrounded in a close contact state together with the circuit board by a molded body,
the cover is embedded in the molded body while being disposed to surround the plurality of terminal fittings,
the cover is formed with an upper wall portion disposed to face the circuit board across the plurality of terminal fittings,
the cover is assembled with the housing, and
the upper wall portion is formed with a transfer opening configured to expose a suction area in an upper surface of the housing.

* * * * *